United States Patent
Iwata et al.

(10) Patent No.: US 10,239,299 B2
(45) Date of Patent: Mar. 26, 2019

(54) LAMINATING APPARATUS

(71) Applicant: Nikko-Materials Co., Ltd., Tokyo (JP)

(72) Inventors: Kazutoshi Iwata, Tokyo (JP); Yoshiaki Honma, Tokyo (JP)

(73) Assignee: NIKKO-MATERIALS CO., LTD., Tokyo (JP)

( * ) Notice: Subject to any disclaimer, the term of this patent is extended or adjusted under 35 U.S.C. 154(b) by 0 days.

(21) Appl. No.: 15/575,442

(22) PCT Filed: Jun. 3, 2016

(86) PCT No.: PCT/JP2016/066520
§ 371 (c)(1),
(2) Date: Nov. 20, 2017

(87) PCT Pub. No.: WO2016/199687
PCT Pub. Date: Dec. 15, 2016

(65) Prior Publication Data
US 2018/0162111 A1  Jun. 14, 2018

(30) Foreign Application Priority Data
Jun. 8, 2015  (JP) .................. 2015-115700

(51) Int. Cl.
B32B 37/10 (2006.01)
B30B 15/34 (2006.01)
(Continued)

(52) U.S. Cl.
CPC .......... *B32B 37/1054* (2013.01); *B29C 43/58* (2013.01); *B30B 15/34* (2013.01);
(Continued)

(58) Field of Classification Search
CPC ..... B29C 43/28; B29C 43/36; B29C 66/8322; B29C 66/9231; B29C 66/92311;
(Continued)

(56) References Cited

U.S. PATENT DOCUMENTS

2015/0021829 A1* 1/2015 Nakahashi ............ B29C 43/021
264/331.11

FOREIGN PATENT DOCUMENTS

JP  2002-120100  4/2002
JP  2003-291168  10/2003
(Continued)

OTHER PUBLICATIONS

Official Communication issued in Patent Application No. PCT/JP2016/066520, dated Aug. 16, 2016, with English language translation.
(Continued)

*Primary Examiner* — George R Koch
(74) *Attorney, Agent, or Firm* — Greenblum & Bernstein, P.L.C.

(57) ABSTRACT

A laminating apparatus includes workpiece transport units, a vacuum laminating device and a flat press device. The flat press device includes a ball screw having a screw shaft and supporting a first one of a pair of pressing elements, a servomotor connected to the screw shaft of the ball screw, a gap measuring device (linear scale) for measuring a distance between the first pressing element and the second pressing element, and a pressing gap control system for moving the first pressing element to a position in which a predetermined gap is defined between the first pressing element and the second pressing element to stop the first pressing element at that position. The pressing gap control system changes the RPM of the servomotor, based on information on the distance between the first and second pressing elements which is provided from the gap measuring device.

2 Claims, 4 Drawing Sheets

(51) Int. Cl.
  *B32B 41/00*  (2006.01)
  *H05K 3/46*  (2006.01)
  *B29C 43/58*  (2006.01)
  *B29C 43/28*  (2006.01)
  *B29L 31/34*  (2006.01)

(52) U.S. Cl.
  CPC .......... *B32B 37/1018* (2013.01); *B32B 41/00* (2013.01); *H05K 3/4655* (2013.01); *B29C 43/28* (2013.01); *B29C 2043/5808* (2013.01); *B29C 2043/5833* (2013.01); *B29K 2905/00* (2013.01); *B29L 2031/34* (2013.01); *B29L 2031/3425* (2013.01); *B32B 2457/08* (2013.01); *H05K 2203/0278* (2013.01); *H05K 2203/063* (2013.01); *H05K 2203/085* (2013.01); *H05K 2203/163* (2013.01)

(58) Field of Classification Search
  CPC .............. B29C 66/93451; B05B 15/34; B32B 37/1018; B32B 37/1054; B32B 41/00; H05K 3/00; H05K 3/4655
  USPC .................................. 156/358, 360, 367, 378
  See application file for complete search history.

(56) References Cited

FOREIGN PATENT DOCUMENTS

| JP | 2004-090398 | 3/2004 |
|----|-------------|--------|
| JP | 2008-012918 | 1/2008 |
| JP | 2009-166487 | 7/2009 |
| JP | 2010-099730 | 5/2010 |
| JP | 2016-16628  | 2/2016 |

OTHER PUBLICATIONS

Office Action issued in Japan Counterpart Patent Appl. No. 2016-536790, dated Feb. 16, 2017, with English language translation.
Official Communication issued in Patent Application No. PCT/JP2016/066520, dated Dec. 21, 2017, English language translation.

* cited by examiner

FIG.2 (Step C)

RELATED ART

LAMINATING APPARATUS

This application is a 371 of PCT/JP2016/066520, filed on Jun. 3, 2016.

TECHNICAL FIELD

The present invention relates to a laminating apparatus capable of laminating a circuit board and a resin film together uniformly to a desired thickness.

BACKGROUND ART

With the decreasing size and increasing performance of electronic devices, multi-layered circuit boards known as "build-up boards" have been used more frequently as electronic circuit boards incorporated in these electronic devices. Each of the build-up boards is produced by alternately laminating circuit boards having surfaces with asperities formed by printed interconnect lines and the like and electrically insulative resin films together in a multi-layered fashion. Laminating apparatuses disclosed in PTL 1 and shown in FIGS. 3 and 4, for example, are used for the manufacture of the build-up boards.

The laminating apparatus shown in FIG. 3 includes workpiece transport units (steps A and A'; indicated by dash-and-dot lines hereinafter), a vacuum laminating device (step B), a flat press device (step C), and a cooling device (step D). Specifically, the workpiece transport units (steps A and A') intermittently transport sheet-like workpieces W, each of which includes a circuit board and an electrically insulative resin film merely placed on the circuit board, in the direction of the sequence of steps (in a direction from right to left as seen in the figure) while holding the workpieces W between upper and lower transporting films F and F' (made of PET or the like) unwound from transporting film unwinding machines 10 and 10'. The vacuum laminating device (step B) is disposed in the course of the workpiece transport step (A→A') in contiguous relation thereto, and includes a vacuum laminating device 50 and the like. The flat press device (step C) makes a workpiece W in which the resin film is brought into intimate contact with the circuit board by the vacuum laminating device into a build-up board (product) having a uniform overall thickness by flattening a surface of the resin film of the workpiece W, and includes a flat press device 60 and the like. The cooling device (step D) cools the build-up board (product) having passed through the flat press device.

In the laminating apparatus shown in FIG. 3, the reference characters 22 and 22' in the vacuum laminating device 50 designate heating platens each containing a heater and the like, and the reference characters 24 and 24' designate vacuum frames for forming a reduced-pressure space (vacuum portion) between upper and lower plates 21 and 21'. The reference numeral 51 designates a hydraulic cylinder used for moving the lower plate 21' upwardly and downwardly; 53 designates a press stand; and 54 designates a support post for supporting the lower plate 21' movably up and down. The hydraulic cylinder 51 may be an air cylinder.

FIG. 4 is a partial enlarged view of the flat press device 60 in the laminating apparatus shown in FIG. 3. The flat press device 60 includes: a plurality of (only two out of four at four corners are shown in FIGS. 3 and 4) support posts 64 provided upright on a press stand 63; an upper press block 31 fixed to the support posts 64 with fixtures such as bolts and nuts; and a lower press block 31' fixed to the support posts 64 movably up and down. In the figure, the reference characters 32 and 32' designate heating platens for heating the workpiece W with the resin film in intimate contact with the circuit board.

In the flat press device 60, the lower press block 31' is coupled to a hydraulic cylinder 61 via a joint (not shown) or the like, as in the vacuum laminating device 50. Thus, the lower press block 31' is configured to move upwardly and downwardly as a piston rod of the hydraulic cylinder 61 moves upwardly and downwardly. The hydraulic cylinder 61 may be an air cylinder.

In some cases, a plurality of hydraulic cylinders or air cylinders are used in place of the aforementioned single hydraulic cylinder (designated by the reference numeral 51 or 61) to move the lower press block 31' of the flat press device 60 and the lower plate 21' of the vacuum laminating device 50 upwardly and downwardly. For example, as shown in FIG. 5, a known structure for moving the press block 31' upwardly and downwardly includes a total of five hydraulic cylinders: four (only two out of four are shown) hydraulic cylinders 62 disposed at the four respective corners of the press block 31' in addition to the hydraulic cylinder 61 disposed at the center of the press block 31' as seen in plan view.

With regard to the laminating apparatus including the aforementioned steps A to D, the present applicant has already proposed a laminating apparatus in which a vacuum laminating device including upper and lower plates each having a surface provided with an elastic pressing plate made of a heat-resisting rubber is used as the vacuum laminating device of the laminating apparatus to thereby bringing a laminating material (resin film) into tightly intimate contact with and into following engagement with a to-be-laminated material (board) without bubbles between the to-be-laminated material and the laminating material even when the surface of the to-be-laminated material has asperities (interconnect lines) of fine spacing (on the order of 20 µm) or of great depth (not less than 40 µm) (PTL 2).

With regard to the laminating apparatus including the aforementioned steps A to D, the present applicant has also proposed a laminating method in which upper and lower press blocks each having a surface (on press side) provided with a flexible metal plate, with a buffer material therebetween, are used for a flat press device used as the flat press device of the laminating apparatus to thereby provide a laminate having a uniform overall thickness and including a resin film having a surface that is a flat surface excellent in specularity (PTL 3).

RELATED ART DOCUMENT

Patent Document

PTL 1: JP-A-2002-120100
PTL 2: JP-A-2008-12918
PTL 3: JP-A-2003-291168

SUMMARY OF INVENTION

In these laminating apparatuses, the vacuum laminating device and the flat press device do not have a feedback control system as a single unit, and the press pressure on each workpiece W is proportional to the pressure of a working fluid supplied to the hydraulic cylinders or the air cylinders used for forcing up the lower plate or the press block. The operating speed of the hydraulic cylinders or the air cylinders is controlled by a speed controller (flow regulating valve) interposed in a flow passage of the working fluid.

In recent years, there has been a demand to control the thickness of products at a higher level so as to achieve a more uniform thickness of the products. In particular, when sealing (film laminate) with a resin film is used as an alternative to a resin mold in aboard mounted with a light-emitting element such as an LED, products having different thicknesses result in a difference in LED element color and in temperature. That is, variations in thickness of products increase a fraction defective to reduce yields. It is hence highly desirable to develop a laminating apparatus capable of controlling the thickness of products at a more precise level to suppress variations in the thickness of products from lot to lot.

In view of the foregoing, it is therefore an object of the present invention to provide a laminating apparatus capable of precisely controlling the stopping position of a pressing element, such as a press block, for pressing a workpiece in a flat press device of the laminating apparatus to reduce variations in thickness of resultant products.

To accomplish the aforementioned object, a first aspect of the present invention is intended for a laminating apparatus comprising: a workpiece transport unit for transporting a workpiece including a circuit board and a resin film for lamination placed on the circuit board; a vacuum laminating device for applying pressure to the workpiece by sandwiching the workpiece between a pair of pressing elements under a reduced-pressure condition to bring the resin film into intimate contact with a surface of the circuit board; and a flat press device for pressing the workpiece with the resin film in intimate contact with the circuit board by sandwiching the workpiece between a pair of first and second pressing elements to flatten a surface of the resin film, wherein the flat press device includes a ball screw having a screw shaft and supporting the first pressing element, a servomotor connected to the screw shaft of the ball screw, a gap measuring device for measuring a distance between the first pressing element and the second pressing element, and a pressing gap control system for moving the first pressing element to a position in which a predetermined gap is defined between the first pressing element and the second pressing element to stop the first pressing element at that position, and wherein the pressing gap control system changes the RPM of the servomotor, based on information on the distance between the first and second pressing elements which is provided from the gap measuring device.

In particular, a second aspect of the present invention is intended for the laminating apparatus wherein the pressing gap control system changes the RPM of the servomotor step by step, based on the information on the distance between the first and second pressing elements which is provided from the gap measuring device, and wherein the pressing gap control system includes an approach speed program for controlling the speed at which the first pressing element approaches the second pressing element.

The present inventors have diligently made studies to solve the aforementioned problem. As a result, the present inventors have found that the use of the ball screw, the servomotor, the gap measuring device for measuring the distance between the pressing elements and the pressing gap control system in the flat press device in place of the hydraulic cylinder and the air cylinder which are used widely as an elevating mechanism for the pressing element such as a plate and a press block for pressing the workpiece achieves the precise settings of the elevating speed of the pressing element, the stopping position of the pressing element and the pressing force of the pressing element in accordance with the desired quality of the product to reproduce the product having a more uniform thickness with accuracy.

The laminating apparatus according to the present invention includes the flat press device for pressing the workpiece having passed through the vacuum laminating device and having the resin film in intimate contact with the circuit board by sandwiching the workpiece between the pair of upper and lower pressing elements to flatten the surface of the resin film. The flat press device includes the ball screw supporting the first pressing element, the servomotor connected to the screw shaft of the ball screw, the gap measuring device for measuring the distance between the first pressing element and the second pressing element, and the pressing gap control system for moving the first pressing element to the position in which the predetermined gap is defined between the first pressing element and the second pressing element to stop the first pressing element at that position. The pressing gap control system changes the RPM of the servomotor, based on the information on the distance between the pressing elements which is provided from the gap measuring device.

The speed of rotation or RPM of the servomotor is freely adjustable. Thus, the laminating apparatus according to the present invention is capable of controlling the RPM of the servomotor by means of the pressing gap control system to thereby control the stopping position of the first pressing element (moving side) in the flat press device with accuracy. This achieves the precise settings of the gap between the pressing elements and the pressing force from the pressing elements. The laminating apparatus according to the present invention is therefore capable of setting the processing conditions of the workpiece more finely to achieve a reduction in variations from product lot to product lot and accordingly a reduction in product fraction defective.

Further, the laminating apparatus according to the present invention in which the pressing gap control system changes the RPM of the servomotor step by step, based on the information on the distance between the first and second pressing elements which is provided from the gap measuring device and in which the pressing gap control system includes an approach speed program for controlling the speed at which the first pressing element approaches the second pressing element is capable of reducing the cycle (tact time) of the repeating operation generated for each product lot while maintaining the uniformity of the thickness of the product. The laminating apparatus including the approach speed program is therefore capable of improving the production efficiency of the product.

DESCRIPTION OF EMBODIMENTS

Next, an embodiment according to the present disclosure will now be described in detail with reference to the drawings.

Figure 1:
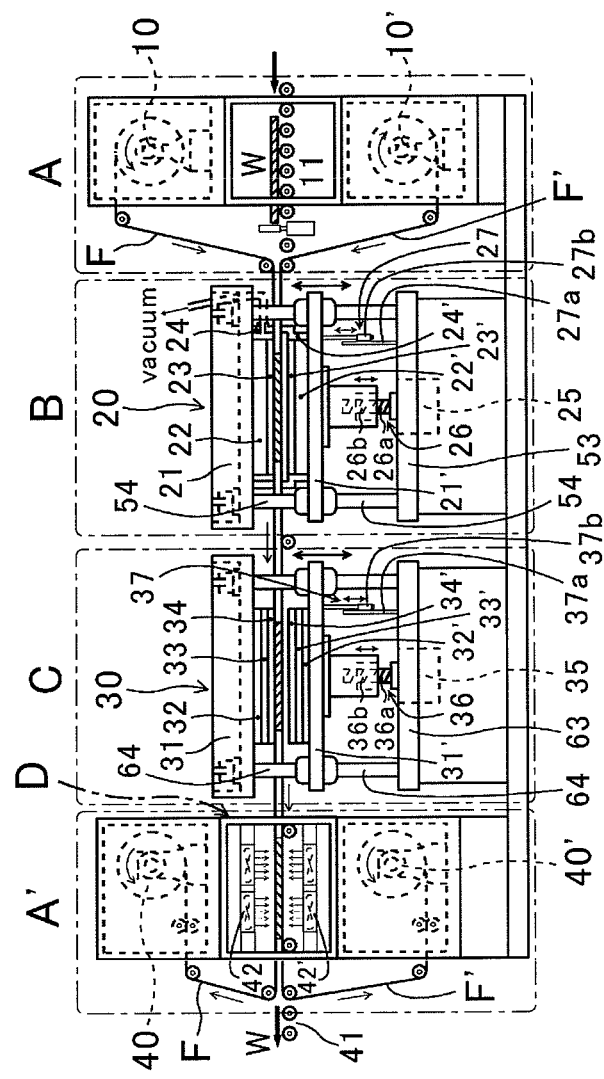
FIG. 1 is a schematic view showing a configuration of a laminating apparatus according to an embodiment of the present invention.
Figure 2:
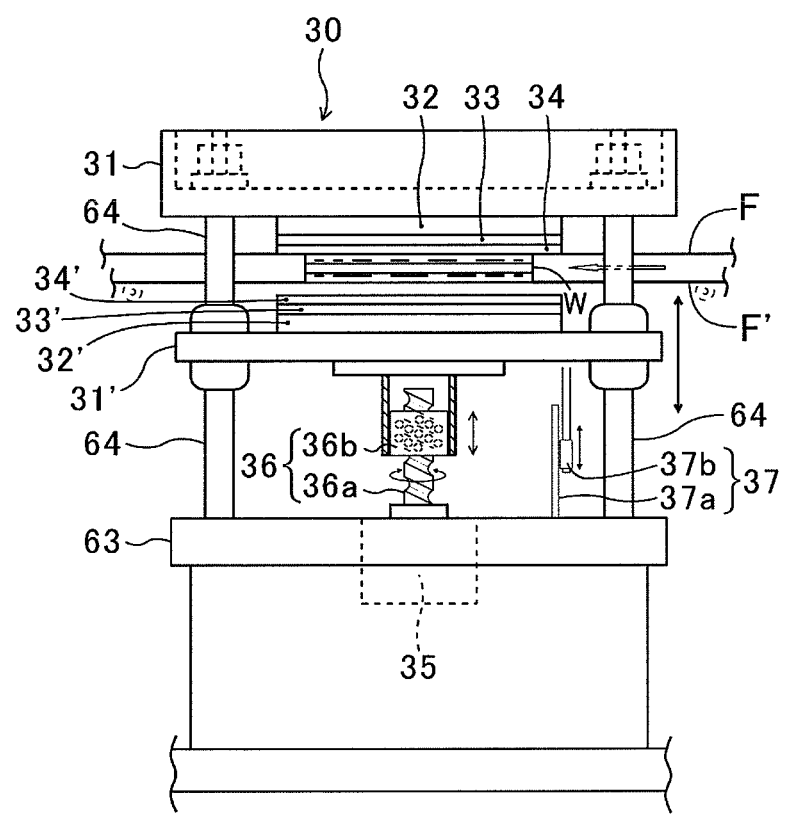
FIG. 2 is an enlarged view of a flat press device (step C) in the laminating apparatus according to the embodiment.
Figure 3:
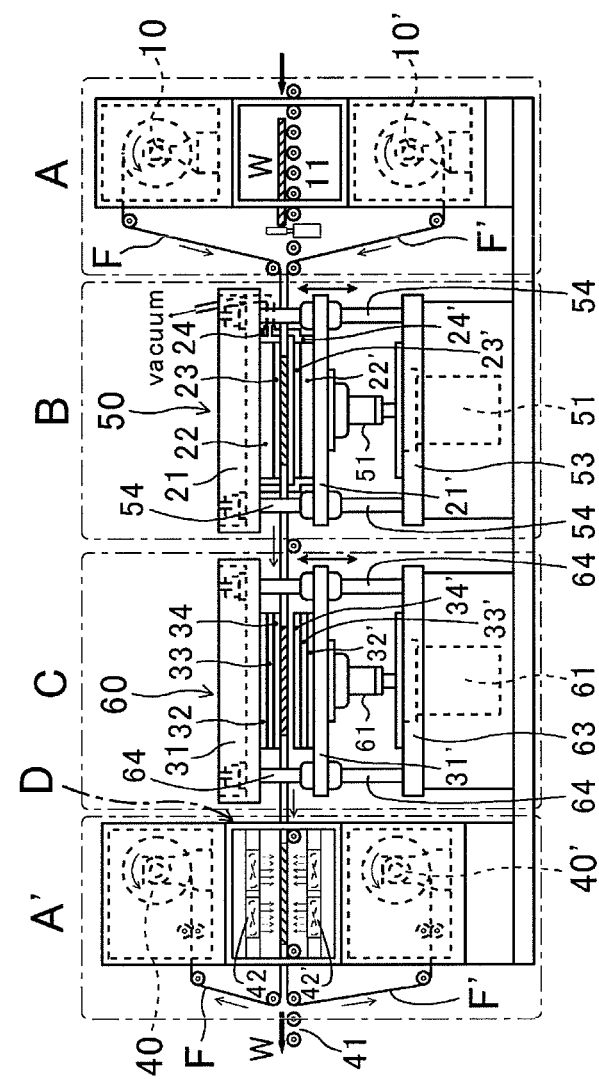
FIG. 3 is a schematic view showing a configuration of a conventional laminating apparatus.

FIG. 1 is a view showing a configuration of a laminating apparatus according to an embodiment of the present disclosure. FIG. 2 is an enlarged view of a flat press device (step C; flat press device 30) shown in FIG. 1. Like reference numerals and characters are used in FIGS. 1 and 2 to designate components similar to those of the related art (FIG. 3).

This laminating apparatus laminates an electrically insulative resin film to a circuit board having a surface with asperities formed by printing interconnect lines and the like thereon, and is especially suitable for the manufacture of a build-up board including circuit boards and resin films that are alternately laminated together in a multi-layered fashion. This laminating apparatus includes workpiece transport units (steps A and A'; indicated by dash-and-dot lines hereinafter), a vacuum laminating device (step B), a flat press device (step C) and a cooling device (step D).

Specifically, this laminating apparatus includes the workpiece transport units (steps A and A'; indicated by dash-and-dot lines hereinafter) including: upper and lower transporting film unwinding machines 10 and 10' and upper and lower transporting film winding machines 40 and 40' which are disposed on opposite ends of the steps (on a right-hand side as seen in the figure serving as a step starting point and on a left-hand side as seen in the figure serving as a step ending point); transporting films F and F'; and a plurality of rollers supporting the transporting films F and F' in a plurality of locations of the steps. The vacuum laminating device (step B), the flat press device (step C) and the cooling device (step D) are disposed in the course of the workpiece transport step (A→A'). The vacuum laminating device (step B) includes a vacuum laminating device 20 that sandwiches a sheet-like workpiece W (temporary laminate including a circuit board and a resin film merely placed on or temporarily fixed on the circuit board) transported by the transporting films F and F' between upper and lower plates 21 and 21' under a reduced-pressure condition to bring the resin film into intimate contact with the surface of the circuit board. The flat press device (step C) includes the flat press device 30 that presses the workpiece W with the resin film in intimate contact with the circuit board between upper and lower press blocks 31 and 31' (a pair of pressing elements) to flatten a surface of the resin film, thereby making the thickness of the workpiece W uniform, so that a product (laminate) is provided. The cooling device (step D) includes fans 42 and 42' for cooling the product obtained by the flat press device.

As shown in FIG. 2, the flat press device 30 in the laminating apparatus according to this embodiment further includes: the pair of press blocks 31 and 31'; a ball screw 36 having a screw shaft 36a and supporting the lower press block 31'; a servomotor 35 connected to the screw shaft 36a of the ball screw 36; a programmable logic controller (PLC) and a servo amplifier (both not shown) for controlling the rotation of the servomotor 35; and a linear scale 37 disposed between the lower press block 31' and a press stand 63.

The servomotor 35 is rotated based on an instruction signal from the PLC to move the lower press block 31' toward the upper press block 31. At this time, the linear scale 37 continuously and indirectly measures a distance (gap) between the press blocks 31 and 31'. The flat press device 30 is set so that information on the distance between the press blocks 31 and 31' measured by the linear scale 37 is fed back to the servo amplifier, and is programmed to control the instruction signal from the PLC, based on the information on the distance between the press blocks 31 and 31'. Thus, the flat press device 30 is capable of changing the RPM of the servomotor 35 step by step or continuously in accordance with the distance between the press blocks 31 and 31' to stop the press block 31' precisely at a preset position. In this manner, the present disclosure includes a pressing gap control system for changing the RPM of the servomotor 35, based on the information on the distance between the press blocks 31 and 31'. This is the most striking feature of the laminating apparatus according to the present disclosure.

Figure 4:
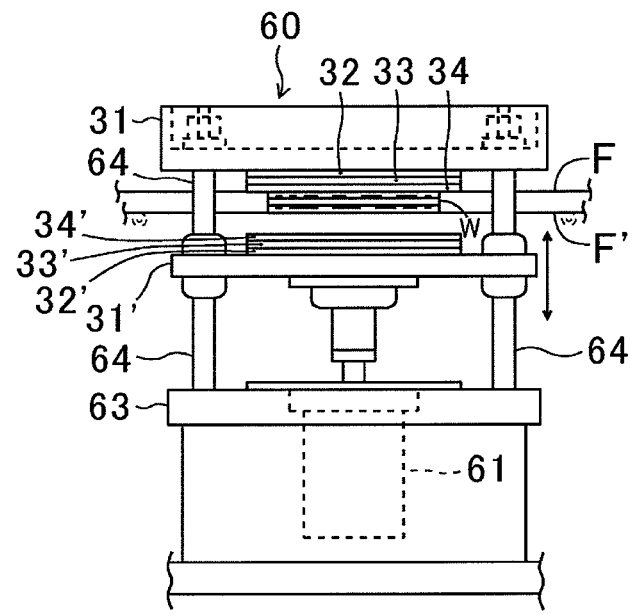
FIG. 4 is an enlarged view of a flat press device used in the conventional laminating apparatus.
Figure 5:
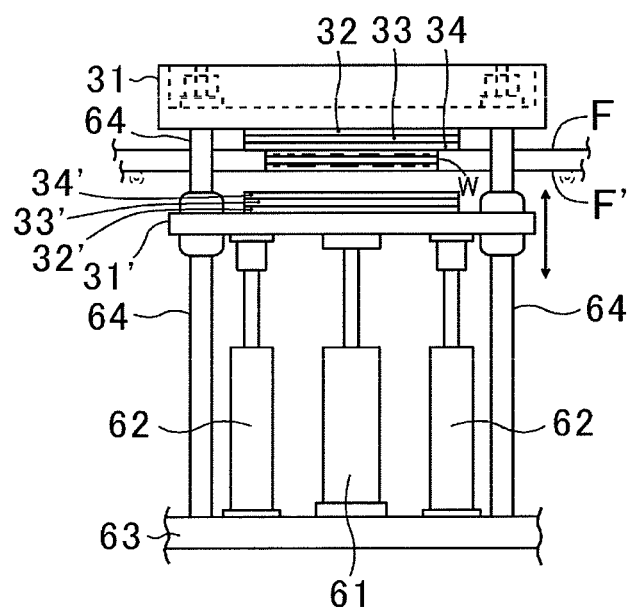
FIG. 5 is a view showing another exemplary configuration of the conventional flat press device.

The configuration of the flat press device 30 in the laminating apparatus according to the present disclosure will be described first in detail, and the configurations of other components will be described next. As shown in FIG. 2, the basic configuration of the flat press device 30 is similar to that of the conventional flat press device 60 (with reference to FIG. 4). The flat press device 30 includes: a plurality of support posts 64 (only two out of four at four corners are shown in FIG. 2) provided upright on the press stand 63; the upper press block 31 fixed to the support posts 64 with fixtures such as bolts and nuts; and the lower press block 31' fixed to the support posts 64 movably up and down.

Heating platens 32 and 32' each containing a heater are mounted respectively on the inside (press side) of the upper and lower press blocks 31 and 31', with a heat-insulating material (not shown) therebetween. Flexible metal plates 34 and 34' are further disposed respectively on the inside (press side) of the heating platens 32 and 32', with buffer materials 33 and 33' therebetween. Thus, the workpiece W having passed through the vacuum laminating device (step B) and having the resin film in intimate contact with the circuit board is pressed between the flexible metal plates 34 and 34'. This makes the thickness of the workpiece W uniform, and provides a product (laminate) in which the surface of the resin film layer is a specular flat surface.

The respective surfaces of the buffer materials 33 and 33' mounted on the inside (press side) of the heating platens 32 and 32' of the press blocks 31 and 31' preferably have a Shore A hardness of not less than 60 degrees, and more preferably in the range of 65 to 75 degrees. If the Shore A hardness is less than 60 degrees, there are cases in which the effect of obtaining the uniformity of the thickness of the resin film (laminate) after the lamination is not produced. The Shore A hardness according to the present disclosure is measured pursuant to JIS Z 2246. The buffer materials 33 and 33' preferably have a thickness in the range of 0.2 to 20 mm, more preferably in the range of 0.2 to 10 mm, and further preferably in the range of 0.2 to 4 mm. If the thickness of the buffer materials 33 and 33' is less than 0.2 mm, there are cases in which the buffer materials 33 and 33' have a low elastic strength, which is not preferable. If the thickness of the buffer materials 33 and 33' is greater than 20 mm, there are cases in which the ends of the buffer materials 33 and 33' are deformed, which is not preferable.

Any one surface-polished material selected from the group consisting of paper, rubber, plastic and the like may be used as the buffer materials 33 and 33'. Of these, rubber is preferably used, and fluororubber is particularly preferably used. Examples of fluororubber used herein include vinylidene fluoride rubber, fluorine-containing silicone rubber, tetrafluoroethylene rubber, fluorine-containing vinyl ether rubber, fluorine-containing phosphonitrile rubber, fluorine-containing acrylate rubber, fluorine-containing nitrosomethane rubber, fluorine-containing polyester rubber and fluorine-containing triazine rubber. The buffer materials 33 and 33' may contain a heat-resisting resin, a glass fiber sheet, a metal foil sheet and the like.

The flexible metal plates 34 and 34' mounted on the inside (press side) of the buffer materials 33 and 33' of the press blocks 31 and 31' preferably have a thickness in the range of 0.1 to 10 mm, and more preferably in the range of 1 to 3 mm. If the thickness of the flexible metal plates 34 and 34' is less than 0.1 mm, there are cases in which the mechanical strength of the flexible metal plates 34 and 34' is decreased. If the thickness of the flexible metal plates 34 and 34' is greater than 10 mm, there are cases in which the flexibility of the flexible metal plates 34 and 34' is decreased. As a result, there are cases in which the effect of obtaining the uniformity of the thickness of the resin film after the lamination is not sufficiently produced. Mirror polishing of the surfaces of the flexible metal plates 34 and 34' by buffing or the like, which provides a uniform mirror surface of a product (laminate), is more preferable.

Examples of the material of the flexible metal plates 34 and 34' include stainless steel, iron, aluminum and aluminum alloys. Stainless steel is preferably used from the viewpoint of anti-rust properties.

An elevating mechanism for the press block 31' is formed in the space lying under the press block 31', and includes: the ball screw 36 including the screw shaft 36a and a nut (ball nut); and the servomotor 35 connected to the screw shaft 36a. The RPM of the servomotor 35 is controlled by the servo amplifier (not shown), based on the instruction signal from the PLC and the fed-back information on the distance between the press blocks 31 and 31'. That is, the lower press block 31' is connected through a joint (not shown) or the like to the nut 36b of the ball screw 36. Thus, the aforementioned configuration is capable of controlling the operation of rotating the servomotor 35 connected to the screw shaft 36a to thereby controlling the press block 31' movably up and down.

The linear scale 37 that measures a distance between the press block 31' and the press stand 63 is further disposed in the space lying under the press block 31'. The linear scale 37 includes: a scale 37a fixed to the press stand 63; and an encoder head 37b mounted to the press block 31' and slidably moving upwardly and downwardly in synchronism with the press block 31'. The linear scale 37 indirectly measures the distance (gap) between the upper press block 31 and the lower press block 31' moving upwardly and downwardly as the servomotor 35 is operated to rotate.

Examples of the linear scale 37 used herein may include linear scales (linear encoders) of a magnetic type having a magnetic head and of an optical type having light-emitting and light-receiving elements. Further, a distance meter in another form capable of measuring the gap between the press blocks 31 and 31' directly or indirectly in a contacting or non-contacting manner may be used in place of the linear scale 37.

The linear scale 37 may be disposed so as to be able to directly measure the gap between the lower press block 31' and the upper press block 31. However, if the linear scale 37 is disposed between the press blocks 31 and 31', there is a danger that the linear scale 37 is affected by heat from the heating platens 32 and 32', which in turn results in a danger that it is difficult for the linear scale 37 to measure a precise gap without consideration of heat. It is hence preferable that the linear scale 37 is disposed in a position remote from the heating platens 32 and 32', e.g. under the press block 31' as in this instance, to measure the distance between the press block 31' and the press stand 63, thereby indirectly measuring the gap between the lower press block 31' and the upper press block 31.

The flat press device 30 includes the servo amplifier (not shown) that controls the operation of rotating the servomotor 35, based on the instruction signal from the PLC and the fed-back information on the distance between the press blocks 31 and 31'. The gap between the press blocks 31 and 31' is controlled not only based on the instruction signal (pressing gap control program) incorporated in the PLC but also by the pressing gap control system set in consideration of a distance signal provided from the linear scale 37. That is, the operation of rotating the servomotor 35 operated by the instruction signal from the PLC is controlled by feeding back the information on the distance between the press blocks 31 and 31' sent from the linear scale 37. In this instance, the press block 31' is moved upwardly by rotating the servomotor 35, based on the instruction signal from the PLC. When the gap between the press blocks 31 and 31' (information on the distance between the press blocks 31 and 31' sent from the linear scale) reaches a preset value, information indicating that the set value is reached is fed back to the instruction signal incorporated in the PLC, so that the rotation of the servomotor 35 is slowed down or stopped. This allows the setting of the stopping position of the press block 31' with higher precision to thereby allow the setting of the gap between the press blocks 31 and 31' with higher precision.

With these arrangements, the laminating apparatus including the flat press device 30 is capable of causing the finished thickness of the product (laminate) to reach a desired thickness as previously set. That is, the laminating apparatus is capable of precisely setting the distance (gap) between the press blocks 31 and 31' in the flat press device 30 to a predetermined value to cause the thickness of the product to have the predetermined value, thereby eliminating the variations in product thickness from press to press. This increases the reproducibility of the product thickness to improve yields.

In particular, the provision of an approach speed program that suppresses the RPM of the servomotor 35 (that is, the speed of upward movement of the press block 31') step by step in accordance with the gap between the press blocks 31 and 31' to control the speed at which the press block 31' approaches the press block 31 achieves the control of the finished (product) thickness of the workpiece W with higher precision. Further, the reduction in cycle (tact time) of the repeating operation generated for each product lot improves production efficiency as compared with conventional steps. The aforementioned approach speed program used herein may be incorporated in the PLC, for example.

The pressing gap control system including the PLC, the ball screw 36, the servomotor 35, the linear scale 37, the servo amplifier and the like may be provided in the vacuum laminating device 20 including an elevating mechanism for pressing elements (plates 21 and 21').

Next, other components of the laminating apparatus than the flat press device 30 (step C) will be described.

First, the workpiece transport units (steps A and A') include: the upper and lower transporting film unwinding machines 10 and 10' positioned at the step starting point; a carrying-in conveyor portion 11 for carrying in the workpiece W (temporary laminate with the resin film merely placed on or temporarily fixed on the circuit board); the transporting film winding machines 40 and 40' disposed at the step ending point; a carrying-out portion 41 for carrying out the workpiece W; the transporting films F and F' for transporting the workpiece W; and a plurality of guiding rollers and the like supporting the transporting films F and F' in a plurality of locations.

Workpieces W supplied in succession at predetermined intervals from the carrying-in conveyor portion 11 are held intermittently at predetermined intervals between the upper and lower transporting films F and F' unwound from the respective transporting film unwinding machines 10 and 10'. While being guided by the guiding rollers in synchronism with the traveling of the transporting films F and F', each workpiece W passes between the upper and lower plates 21 and 21' of the vacuum laminating device 20, between the upper and lower press blocks 31 and 31' of the flat press device 30 and via the cooling device (step D), and is thus formed into a product (laminate). Then, the holding of the product between the transporting films F and F' is released.

After releasing the holding of the product therebetween, the transporting films F and F' are wound on the transporting film winding machines 40 and 40', respectively, and are put to reuse and the like. After the holding of the product (laminate) between the transporting films F and F' is released, the product (laminate) is carried out of the carrying-out portion 41 at the step ending point (on the left-hand side as seen in the figure).

For example, films made of polyethylene terephthalate (PET) are preferably used as the transporting films F and F'. Examples of such films include "EMBLET PTH Series" available from Unitika Ltd., "Matte Film Series" available from Diafoil Co., Ltd., and "Lumirror Series" available from Toray Industries, Inc. It is preferable that the width of the transporting films F and F' is approximately 10 to 40 mm greater than the width of the workpieces W so that the melted resin film (laminated film) of the workpieces W does not leak out in the width direction. The transporting films F and F' are generally placed under a tension of 0.5 to 150 N.

Next, the vacuum laminating device (step B) including the vacuum laminating device 20 applies heat and pressure under a reduced-pressure vacuum condition to a workpiece W transported by the transporting films F and F' to bring the resin film of the workpiece W into intimate contact with the circuit board.

The vacuum laminating device 20 includes: a plurality of support posts 54 provided upright on a press stand 53; the upper pressing element (plate 21) fixed to the support posts 54 with fixtures such as bolts and nuts; and the lower pressing element (plate 21') fixed to the support posts 54 movably up and down.

Heating platens 22 and 22' each containing a heater are mounted respectively on the inside (press side) of the upper and lower plates 21 and 21', with a heat-insulating material (not shown) therebetween. Elastic pressing plates 23 and 23' made of a heat-resisting rubber or the like are further disposed respectively on the inside (press side) of the heating platens 22 and 22'. Vacuum frames 24 and 24' (movable vacuum frames) moving relatively integrally with the plates 21 and 21' are disposed respectively around the upper and lower plates 21 and 21' and the heating platens 22 and 22'. When the lower plate 21' is moved upwardly to a predetermined position, an enclosed space is defined between the upper and lower plates 21 and 21', so that the pressure in the enclosed space can be reduced.

In this vacuum laminating device 20, the lower plate 21' is supported by a ball screw 26 and a servomotor 25, and a linear scale 27 that measures a distance between the plate 21' and the press stand 53 is disposed in the space lying under the plate 21', as in the flat press device 30. The linear scale 27 includes: a scale 27a fixed to the press stand 53; and an encoder head 27b mounted to the plate 21' and slidably moving upwardly and downwardly in synchronism with the plate 21'. The linear scale 27 indirectly measures the distance (gap) between the upper plate 21 and the lower plate 21' moving upwardly and downwardly as the servomotor 25 is operated to rotate. This vacuum laminating device 20 includes a servo amplifier (not shown) that controls the operation of rotating the servomotor 25, based on an instruction signal from a PLC and a fed-back distance signal provided from the linear scale 27. The vacuum laminating device 20 is thus capable of moving the lower plate 21' to a position in which a predetermined gap is defined between the upper plate 21 and the lower plate 21', and stopping the lower plate 21' at that position.

With this arrangement, the vacuum laminating device 20 of the laminating apparatus is capable of causing the thickness of the workpiece W pressed under vacuum to have a desired value previously set. Also, the vacuum laminating device 20 is capable of causing the thickness of the workpiece W at the end of this step to fall within a set range. This allows the press by means of the flat press device 30 that is the next finishing step to increase the accuracy of the thickness of the product. In the vacuum laminating device 20, the servomotor or the like need not be used, but the plate may be moved upwardly and downwardly by means of a hydraulic cylinder, an air cylinder or the like. That is, only the provision of the pressing gap control system in the flat press device 30 sufficiently increases the accuracy of the thickness of the product.

Next, the cooling device (step D) for cooling the product obtained by the aforementioned flat press includes the fans 42 and 42' over and under the transporting films F and F', as shown in FIG. 1. Specifically, the cooling device blows air (cool air) downwardly and upwardly toward the product held between the transporting films F and F' and transported from the flat press device 30 to cool the product. The cooling device (step D) is not necessary depending on the type of the resin film used and the like, and need not necessarily be provided.

The transporting films F and F' are separated from the front and back surfaces of the cooled product, so that the holding of the cooled product between the transporting films F and F' is released. After the holding of the cooled product between the transporting films F and F' is released, the product is carried out of the laminating apparatus by means of the carrying-out portion 41. After releasing the holding of the product therebetween, the transporting films F and F' are wound on the transporting film winding machines 40 and 40', respectively.

EXAMPLES

Next, an example of the present disclosure in which the aforementioned laminating apparatus (FIG. 1) was used to manufacture a product (laminate) from a workpiece W (temporary laminate) will be described. It should be noted that the present disclosure is not limited to the example.

First, a resin film for lamination including an epoxy resin composition layer (with a glass transition temperature of 80° C. and a thickness of 42.5 µm) and a polyethylene terephthalate layer (support layer, with a thickness of 38 µm) was placed on a front surface of a circuit board (with a thickness of 0.4 mm, an interconnect line thickness of 18 µm, and an interconnect line spacing of 20 µm) having the front and back surfaces with asperities (interconnect lines). An automatic sheet cut laminator was used to temporarily fix the resin film on the circuit board. Thus, a workpiece W (temporary laminate) was produced.

Then, the transporting films F and F' (with a thickness of 26 μm and a surface roughness Rz of 4 μm) made of polyethylene terephthalate were unwound from the transporting film unwinding machines 10 and 10' and were passed through the entire steps. Then, the transporting films F and F' were set so as to be wound on the transporting film winding machines 40 and 40'. Prior to vacuum lamination, the temperature of the heating platens 22 and 22' of the vacuum laminating device 20 was raised to 110° C., so that the interior of an enclosed space defined between the vacuum frames 24 and 24' and the upper and lower plates 21 and 21' was heated. Also, the temperature of the heating platens 32 and 32' of the flat press device 30 was raised to 100° C.

With preparations completed, the workpiece W was carried from the carrying-in conveyor portion 11 into the laminating apparatus. Then, the workpiece W was held between the transporting films F and F' unwound from the transporting film unwinding machines 10 and 10'. In that state, the transporting films F and F' were moved to move the workpiece W to a predetermined position lying between the plates 21 and 21' of the vacuum laminating device 20.

Then, the servomotor 25 was rotated to move the lower plate 21' of the vacuum laminating device 20 upwardly. This brought the vacuum frames 24 and 24' into engagement with each other to define an enclosed space between the plates 21 and 21'.

Next, a vacuum pump (not shown) was actuated. After a decrease in pressure in the enclosed space to 100 Pa was verified, the lower plate 21' was further moved upwardly. The upward movement of the lower plate 21' was stopped when a gap between the elastic pressing plates 23 and 23' disposed respectively on the surfaces (press side) of the plates 21 and 21' reached 0.42 mm. This posture was maintained for 20 seconds to apply pressure to the workpiece W. Thereafter, the pressure in the enclosed space was returned to atmospheric pressure, and the lower plate 21' was moved downwardly. Thus, the step B by means of the vacuum laminating device was completed.

After the step B by means of the vacuum laminating device was completed so that the resin film of the workpiece W was in intimate contact with the surface of the circuit board, the transporting films F and F' were moved to move the workpiece W to a predetermined position lying between the press blocks 31 and 31' of the flat press device 30.

Specifically, the servomotor 35 was rotated based on an instruction signal from the PLC to move the press block 31' upwardly, and a distance signal provided from the linear scale 27 was fed back to the servo amplifier (not shown). The servomotor 35 was controlled to completely stop rotating when the press blocks 31 and 31' had a previously set predetermined gap therebetween (in this example, when a gap between the flexible metal plates 34 and 34' disposed respectively on the surfaces (press side) of the press blocks 31 and 31' reached 0.42 mm). This ensures the precise positioning of the press block 31'.

The posture in which the gap between the flexible metal plates 34 and 34' was 0.42 mm was maintained for 50 seconds. Specifically, pressure and heat were applied to the workpiece W with the resin film in intimate contact with the circuit board for 50 seconds to form the workpiece W into a product. Thereafter, the lower press block 31' was moved downwardly to release the pressure application. Thus, the step C by means of the flat press device was completed.

The product obtained after the completion of the step C by means of the flat press device was transported to a cooling stage by moving the transporting films F and F'. In this cooling stage, the product was cooled by blowing air from the fans 42 and 42' thereto [cooling device (step D)]. Thereafter, the transporting films F and F' were separated upwardly and downwardly. The transporting films F and F' were wound respectively on the transporting film winding machines 40 and 40'. The product released from between the transporting films F and F' was carried out of the laminating apparatus by means of the carrying-out portion 41.

The distance from the processing position of the workpiece W in the vacuum laminating device 20 to the processing position of the workpiece W in the flat press device 30 is approximately equal to the distance from the processing position of the workpiece W in the flat press device 30 to the cooling state (the location where air blown from the fans 42 and 42' impinges) because the steps are performed in succession. The positions of the workpiece W or product in the three location, i.e. the vacuum laminating device 20, the flat press device 30 and the cooling stage [cooling device (step D)], are automatically determined by moving the transporting films F and F' intermittently.

In the laminating apparatus having the aforementioned configuration, the resin film in intimate contact with the circuit board is first fixed in a predetermined position on the circuit board by the vacuum laminating device. This prevents the resin film from being out of position and from being twisted due to the next press by means of the flat press device. In addition, the flat press device includes the pressing gap control system that feeds the information on the distance between the press blocks 31 and 31' (pressing elements) back to the instruction signal from the PLC to change the RPM of the servomotor 35. Thus, the thickness of the product is not conventionally controlled based on experiments but is correctly precisely set from the beginning. The obtained product is cooled quickly by the non-contacting cooling device in the cooling stage. This promotes the curing of the film resin to avoid the deformation or the like thereof during the transport or carrying-out thereof. That is, the laminating apparatus is capable of causing the thickness of the product to have a desired constant value previously set to significantly reduce variations in thickness from product lot to product lot, as compared with the conventional manufacturing methods.

Although specific forms in the present disclosure have been described in the aforementioned example, the aforementioned example should be considered as merely illustrative and not restrictive. It is contemplated that various modifications evident to those skilled in the art could be made without departing from the scope of the present disclosure.

The laminating apparatus according to the present disclosure is capable of laminating the circuit board and the resin film used for electrical insulation between boards together to a precise thickness, and is suitable for the manufacture of products (laminates) required to have a precise finished thickness, such as build-up boards and boards mounted with light-emitting elements including LEDs and the like.

REFERENCE SIGNS LIST

20 Vacuum laminating device
30 Flat press device
31 and 31' Press blocks
35 Servomotor
36 Ball screw 36a Screw shaft
37 Linear scale
W Workpiece

The invention claimed is:

1. A laminating apparatus comprising:
a workpiece transport unit transporting a workpiece including a circuit board and a resin film for lamination placed on the circuit board;
a vacuum laminating device applying pressure to the workpiece by sandwiching the workpiece between a pair of pressing elements under a reduced-pressure condition to bring the resin film into intimate contact with a surface of the circuit board; and
a flat press device pressing the workpiece with the resin film in intimate contact with the circuit board by sandwiching the workpiece between a pair of first and second pressing elements to flatten a surface of the resin film,
wherein the flat press device includes a ball screw having a screw shaft and supporting the first pressing element, a servomotor connected to the screw shaft of the ball screw, a gap measuring device measuring a distance between the first pressing element and the second pressing element, and a pressing gap control system moving the first pressing element to a position in which a predetermined gap is defined between the first pressing element and the second pressing element to stop the first pressing element at that position,
wherein the gap measuring device is a linear scale including a scale and an encoder head provided below the pair of pressing elements; and
wherein the pressing gap control system changes a revolutions per minute (RPM) of the servomotor, based on information on the distance between the first and second pressing elements which is provided from the gap measuring device.

2. The laminating apparatus according to claim 1,
wherein the pressing gap control system changes the RPM of the servomotor step by step, based on the information on the distance between the first and second pressing elements which is provided from the gap measuring device, and
wherein the pressing gap control system includes an approach speed program controlling the speed at which the first pressing element approaches the second pressing element.

* * * * *